United States Patent
Takahashi et al.

[11] Patent Number: 6,080,651
[45] Date of Patent: Jun. 27, 2000

[54] WIRE BONDING METHOD

[75] Inventors: Kuniyuki Takahashi, Musashimurayama; Tooru Mochida, Higashiyamato; Tatsunari Mii, Musashimurayama; Nobuto Yamazaki, Kunitachi, all of Japan

[73] Assignee: Kabushiki Kaisha Shinkawa, Tokyo, Japan

[21] Appl. No.: 09/042,842

[22] Filed: Mar. 17, 1998

[30] Foreign Application Priority Data

Mar. 17, 1997 [JP] Japan .................................. 9-083234

[51] Int. Cl.⁷ .......................... H01L 21/447; H01L 21/60
[52] U.S. Cl. .......................... 438/617; 438/674; 438/907; 228/180.5; 228/904
[58] Field of Search .................................... 438/617, 674, 438/907; 228/180.5, 904

[56] References Cited

U.S. PATENT DOCUMENTS

| | | |
|---|---|---|
| 5,350,106 | 9/1994 | Fogal . |
| 5,465,899 | 11/1995 | Quick et al. . |
| 5,544,804 | 8/1996 | Test et al. . |
| 5,565,378 | 10/1996 | Harada et al. . |
| 5,586,713 | 12/1996 | Arita et al. . |
| 5,646,451 | 7/1997 | Freyman et al. . |
| 5,647,527 | 7/1997 | Kenji . |
| 5,665,654 | 9/1997 | Stansbury . |

*Primary Examiner*—David E. Graybill
*Attorney, Agent, or Firm*—Koda & Androlia

[57] ABSTRACT

A wire bonding method in the manufacture of, for instance, a semiconductor device in which first bonding points or pads of a chip and second bonding points or leads of a lead frame are connected by wires, and the bonding by wires is initiated from one end of the row of the first bonding points (pads) and is successively performed in one direction toward a center of the row, and after bonding has been performed up to an approximate center of the row, then bonding is initiated from another end of the row in the opposite direction toward the center of the row.

5 Claims, 5 Drawing Sheets

WIRE BONDING METHOD

BACKGROUND OF THE INVENTION

1. Field of the Invention

The present invention relates to a wire bonding method in which first bonding points and second bonding points are connected by wires in a semiconductor device manufacturing process.

2. Prior Art

As shown in FIG. 4, in semiconductor devices, a wire is bonded so that first bonding points on pads 3 (31, 32 . . . 3N) of a semiconductor chip 2 mounted on a lead frame 1 and second bonding points on leads 4 (41, 42 . . . 4N) of a lead frame 1 are connected by wires 5.

This wire bonding is generally performed by the steps shown in FIG. 5.

As shown in step (a), a capillary 6 is lowered so that a ball formed at the tip end of a wire 5 is bonded to a first bonding point A; afterward, the capillary 6 is raised slightly to point B, delivering the wire 5. Next, in step (b), the capillary 6 is moved horizontally by a slight distance to point C in the opposite direction from the second bonding point E. Generally, moving a capillary in a direction opposite from a second bonding point E during a process of forming a wire loop between the first and second bonding points is called a reverse operation.

Next, in step(c), the capillary 6 is raised to point D (for a distance that corresponds to the amount of wire required for wire loop formation), delivering the wire 5. Afterward, the capillary 6 is moved to the second bonding point E in a circular-arc motion with a radius centered on the first bonding point A or a point near the first bonding point A; and then, the wire 5 is bonded to the second bonding point E.

In most cases, however, as shown in FIG. 4, the pads 3 (31, 32 . . . 3N), the first bonding points, are disposed at equal intervals inside the peripheral edges on the four sides of a semiconductor chip 2. Accordingly, if the number of connections of the wire 5 is large relative to the area of the semiconductor chip 2, the pad pitch (i. e., the distance from the center of a given pad 3 to the center of an adjacent or next pad 3) is inevitably small. In such a case, the area of the pads 3 also needs to be inevitably small.

With the miniaturization of semiconductor devices in recent years, bonding to pads 3 spaced at narrower intervals has become more and more necessary.

In cases where the spacing of pads 3 (pad pitch P1) is relatively wide, a thick capillary 6 as shown in FIG. 6 can be used. However, when the spacing of the pads 3 (pad pitch P2) is narrow, the tip of the capillary 6 may contact adjacent press-bonded balls during bonding, or the capillary 6 may contact and cause a deformation of wire loops that have already been formed. Accordingly, it is necessary to use a thin capillary 6 as shown in FIG. 7. Nonetheless, when the thickness of the capillary 6 is reduced, the mechanical strength of the capillary 6 is correspondingly weakened, so that the useful life of the capillary 6 is shortened.

Furthermore, as shown in FIGS. 6 and 7, the ball 7 formed at the tip of the wire 5 is crushed and deformed by the capillary 6 during the bonding process, and a press-bonded ball 7a is formed. The diameter of such a press-bonded ball 7a is ordinarily two to three times the diameter of the wire 5; accordingly, a spacing that keeps this press-bonded ball 7a from not contacting adjacent pads 3 or press-bonded balls 7a is required.

Accordingly, the pad pitch needs to be the largest of the following three spacings: a spacing that avoids the tip of the capillary 6 from contacting adjacent press-bonded balls 7a during bonding, a spacing that avoids the capillary 6 from contacting wire loops that have already been formed, and a spacing that avoids the press-bonded ball 7a at each bonding point from contacting adjacent pads 3 or press bonded balls 7a.

Conventionally, the bonding order, i. e., the order in which each successive pair of first and second bonding points is connected by a wire after a given pair of first and second bonding points has been connected by a wire, is set so that bonding is performed in one direction, either clockwise or counterclockwise. Generally, the leads 4 (41, 42 . . . 4N), the second bonding points, have a larger lead spacing in between in both structural terms and terms of disposition; as a result, the respective wires 5 that are connected to the leads are not parallel, and they as a whole are instead arranged in a fan-form configuration as shown in FIG. 4. Accordingly, the intermediate portion of the wire loop that is bonded to a pad 32 which is near the corner becomes closer to the pad 31 which is even nearer to the corner. Consequently, when bonding is performed by a wire to the corner pad 31 after a wire has been bonded to the pad 32 (which is next to the corner pad), the capillary 6 is likely to contact and deform the wire loop bonded to the pad 32 as indicated by a circle 6a (which represents the diameter of the axially intermediate portion of the capillary 6) as shown in FIG. 8.

SUMMARY OF THE INVENTION

Accordingly, the object of the present invention is to provide a wire bonding method which performs wire bonding on semiconductor devices that have a narrower pad spacing.

The object is accomplished by a unique wire bonding method that connects first bonding points and second bonding points by wires, and the bonding method of the present invention is characterized in that the bonding order in which wire bonding is respectively performed to a plurality of first bonding points which are arranged in a linear row at substantially equal intervals and second bonding points that correspond to the first bonding points is set so that bonding is initiated from one end of the row and is successively performed in one direction toward the center of the row, and after bonding has been performed up to the approximate center of that row, then bonding is initiated from another end of the row and successively performed in another direction, thus performing wire bonding on the remaining bonding points in that row.

In the above method, the bonding order is automatically set by an operating means of a control device of a bonding apparatus based upon the sequences of coordinate data for the first bonding points and the second bonding points stored in a memory means of the control device prior to the initiation of bonding.

In addition, a part of the wire loop in the vicinity of the uppermost point of each bonded wire is bent slightly toward one end or another end of the row from (imaginary) straight lines that connect the first bonding points and second bonding points.

Furthermore, the method further includes a reverse operation which is performed after bonding is made to the first bonding point, the reverse operation raising the capillary and then moving the capillary in a direction opposite from the second bonding point, and the reverse operation further involving a movement that shifts said capillary toward one end or another end of the row of pads.

In the reverse operation above, the amount in which the capillary is shifted slightly toward one end or another end of the row of pads is automatically set by an operating means of a control device of a bonding apparatus based upon sequences of coordinate data for the first bonding points and second bonding points stored in a memory means of the control device before the bonding is started.

BRIEF DESCRIPTION OF THE DRAWINGS

FIG. 3 shows the path on which the capillary of one embodiment of the wire bonding method of the present invention is moved, in which FIG. 3(a) is an explanatory top view, and FIG. 3(b) is an explanatory front view;

FIG. 6 shows the relationship between the capillary and bonded adjacent wires in a case where the spacing between pads is relatively wide, in which FIG. 6(a) is a view seen from a first bonding point, and FIG. 6(b) is a side view thereof;

FIG. 7 shows the relationship between the capillary and bonded adjacent wires in a case where the spacing between pads is relatively narrow, in which FIG. 7(a) is a view seen from a first bonding point, and FIG. 7(b) is a side view thereof.

DETAILED DESCRIPTION OF THE INVENTION

Figure 1:
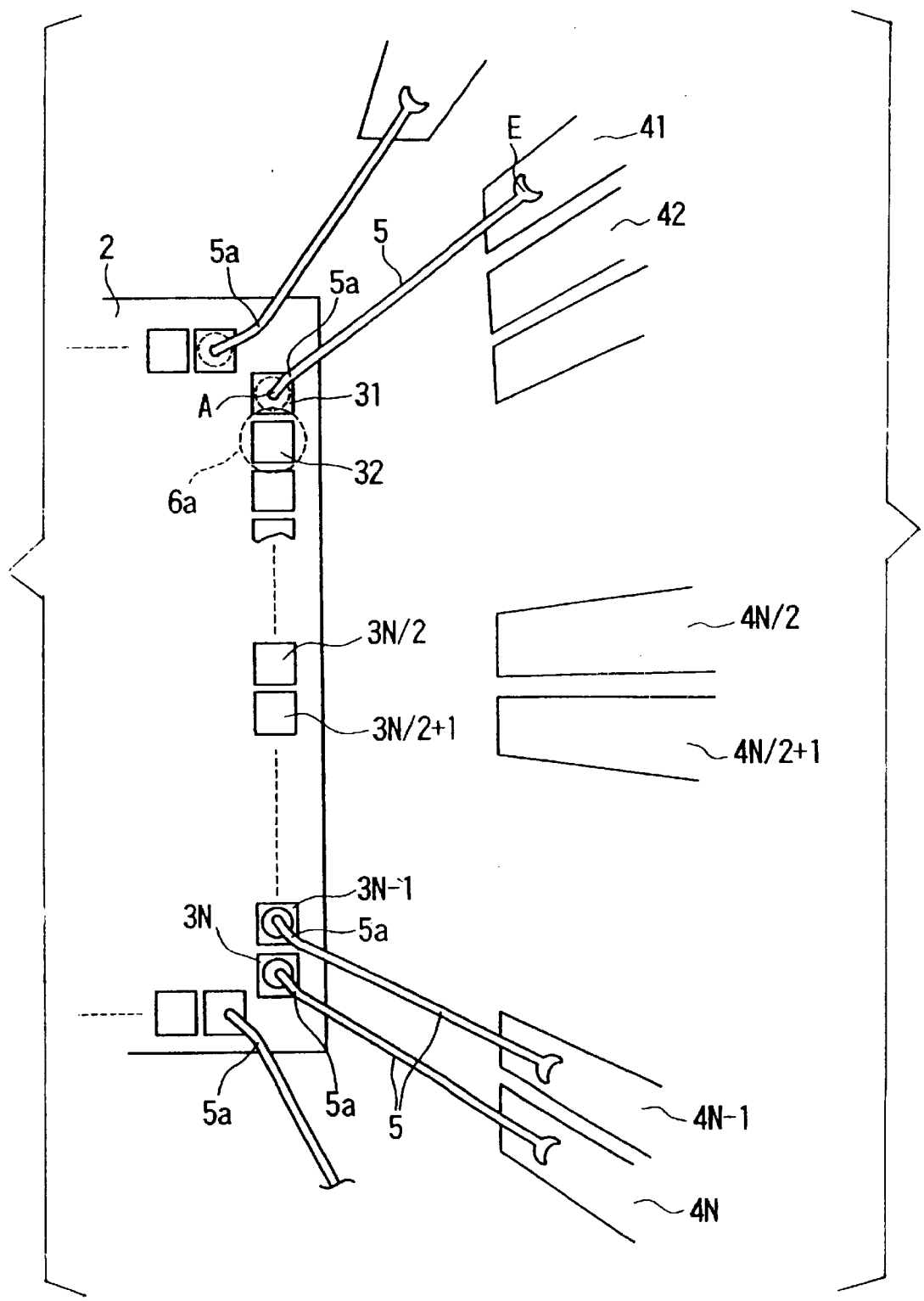
FIG. 1 is an explanatory top view showing the bonding performed by one embodiment of the wire bonding method of the present invention.

A first embodiment of the present invention will be described with reference to FIG. 1.

The order in which bonding is performed on a row of pads 3 (31, 32 . . . 3N), which constitutes first bonding points installed at equal intervals along one side of a semiconductor chip 2, is set so that bonding is successively performed beginning with the pad 31, which is located at one end of the row, and moves to the pad 32 and so on; then, after bonding has been performed on the pad 3N/2 which is located at the center of the row, bonding is performed on the remaining pads of the row by first performing bonding on the pad 3N, which is located at the other end of the row, and then moves to the pad 3N−1 and so on until bonding is performed on the pad 3N/2+1, thus bonding all the pads in that row.

More specifically, the connection of wires 5 between the pads 3 (31, 32 . . . 3N) and the leads 4 (41, 42 . . . 4N) is performed in the following order: the pad 31 and the lead 41 are connected by a wire 5 first, then the connection of the pad 32 and the lead 42 and so on until the connection of the pad 3N/2 and the lead 4N/2 is performed successively. Next, the capillary 6 is moved to a point above the pad 3N which is located at the other end of the row of the pads, and bonding is conversely performed in the following order: the connection of the pad 3N and the lead 4N, the connection of the pad 3N−1 and the lead 4N−1, and so on until the connection of the pad 3N/2−1 and the lead 4N/2−1 is performed successively.

This bonding order is obtained by automatically setting the contents of coordinate data sequences for the first bonding points and second bonding points stored in the memory means of a control device by the operating part of a bonding apparatus.

The angle formed by the direction connecting each first bonding point and second bonding point (i. e., the angle formed by the wire 5) relative to a line perpendicular to the direction of the row of pads 3 (31, 32 . . . 3N) is largest at the end pads 31 and 3N and gradually becomes smaller toward the pads 3N/2 and 3N/2+1 located at the center of the row. In other words, the bonding order is set so that bonding proceeds from pads in which the angle formed by the wire 5 is large to pads in which the angle formed by the wire 5 is small; accordingly, when bonding is performed, the capillary 6 does not contact adjacent wire loops that have already been wire-bonded, and deformation of the wire 5 can be avoided.

A second embodiment of the present invention will be described with reference to FIGS. 1 through 3.

Figure 2:
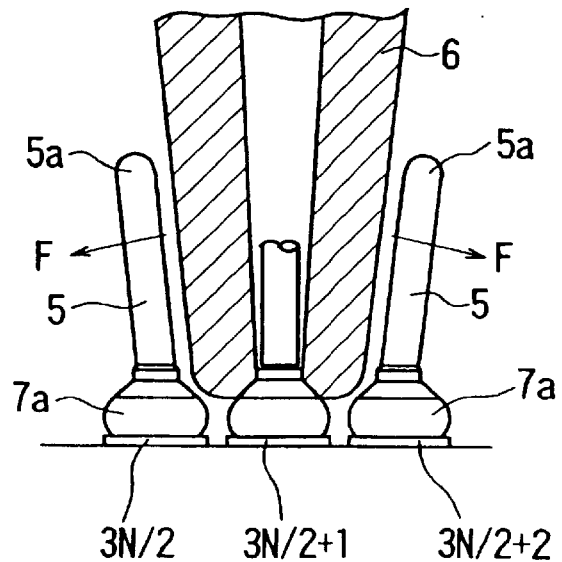
FIG. 2 illustrates the bonding conditions in the central portion of the row of pads.

In this second embodiment, when bonding is performed by the method of the first embodiment, the shape of each wire loop in the vicinity of the uppermost point 5a of each of the bonded wire is, as seen from FIGS. 1 and 2, bent slightly toward one of the ends of the row of pads 3 (31, 32 . . . 3N) from a (imaginary) straight line connecting the first bonding point A and the second bonding point E.

More specifically, for the pads 31, 21 . . . 3N/2 and leads 41, 42 . . . 4N/2, the portion of the wire loop in the vicinity of the uppermost point of the bonded wires 5 is bent toward one end (upper end in FIG. 1) of the row of the pads. Meanwhile, for the pads 3N, 3N1 . . . 3N/2−1 and leads 4N, 4N−1, . . . 4N/2+1, the portion of the wire loop in the vicinity of the uppermost point of each one of the bonded wires is bent toward another end (lower end in FIG. 1) of the row of the pads.

Next, a method for bending the wire loop in the vicinity of the uppermost point of the bonded wire will be described.

Figure 7:
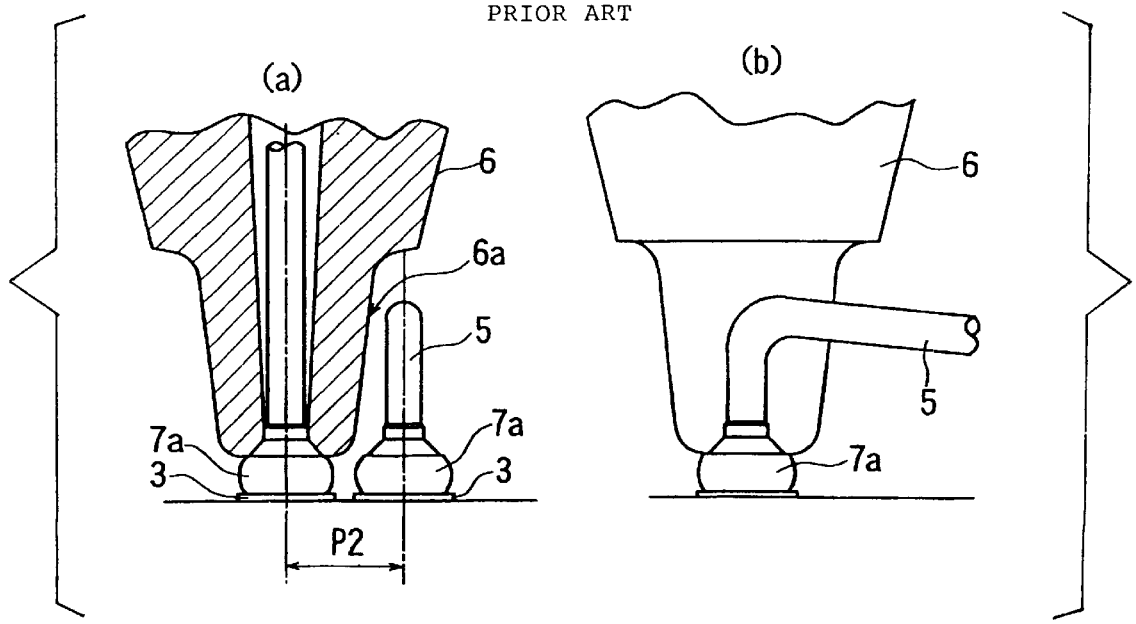
Figure 8:
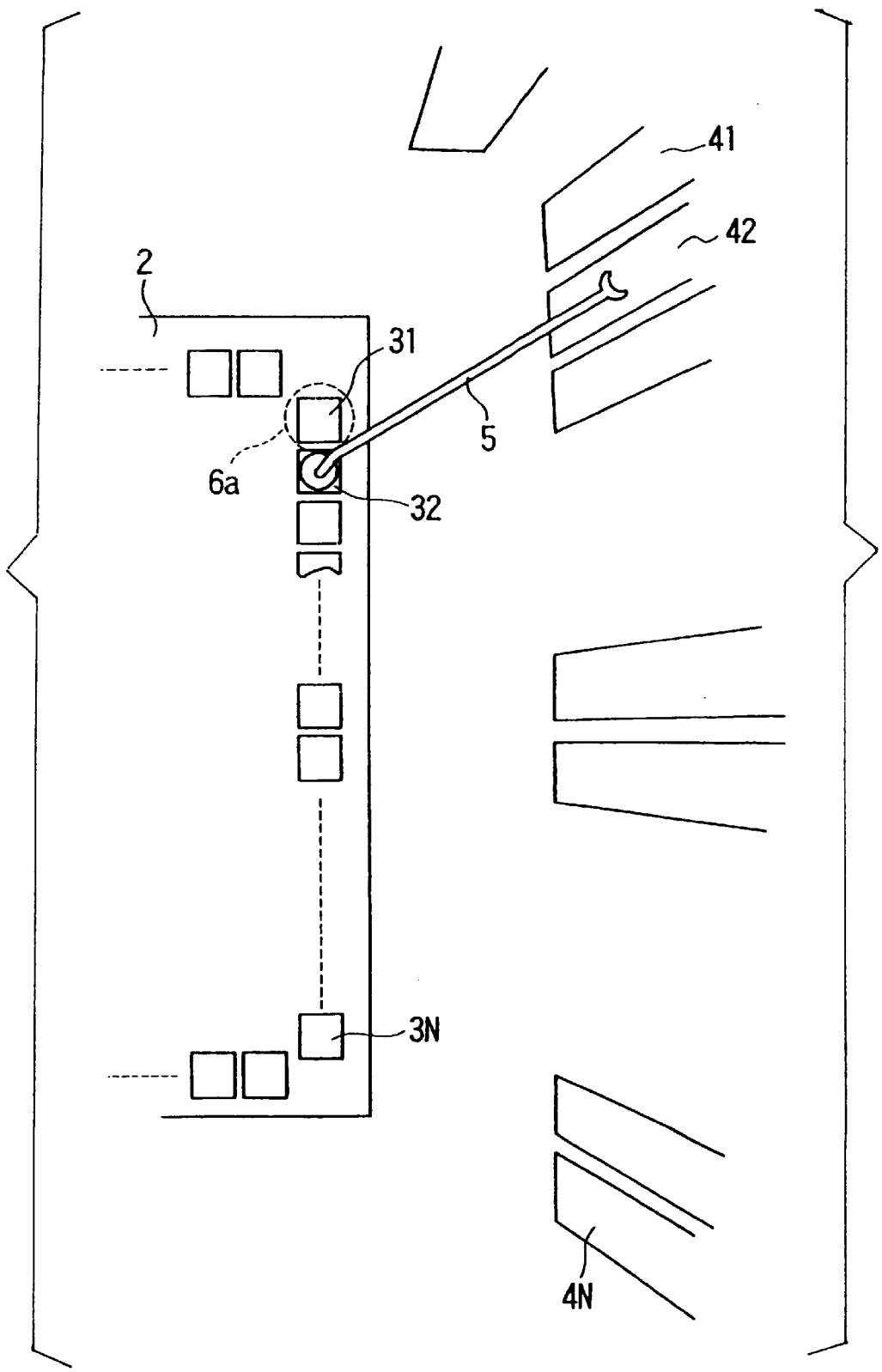
FIG. 8 illustrates a wiring example by a conventional wire bonding method.

In the conventional reverse operation from point B to point C shown in FIG. 7, the capillary 6 is simply moved horizontally in the opposite direction from the second bonding point E. In the reverse operation performed in the shown embodiment of the present invention, the capillary 6 is not simply moved horizontally in the opposite direction from the bonding point E, but it is also moved while being slightly shifted toward one end (upper end in FIG. 1) and further toward another end (lower end in FIG. 1) of the row of the pads. In other words, for the pads 31, 32 . . . 3N/2 and leads 41, 42, . . . 4N/2, the capillary 6 is moved, during the reverse operation, toward one end (upper end in FIG. 1) of the rows of the pads; and meanwhile, for the pads 3N, 3N−1. . . 3N/2−1 and leads 4N., 4N−1, . . . 4N/2+1, the capillary 6 is moved, during the reverse operation, toward another end (lower end in FIG. 1) of the row of the pads.

Figure 3:
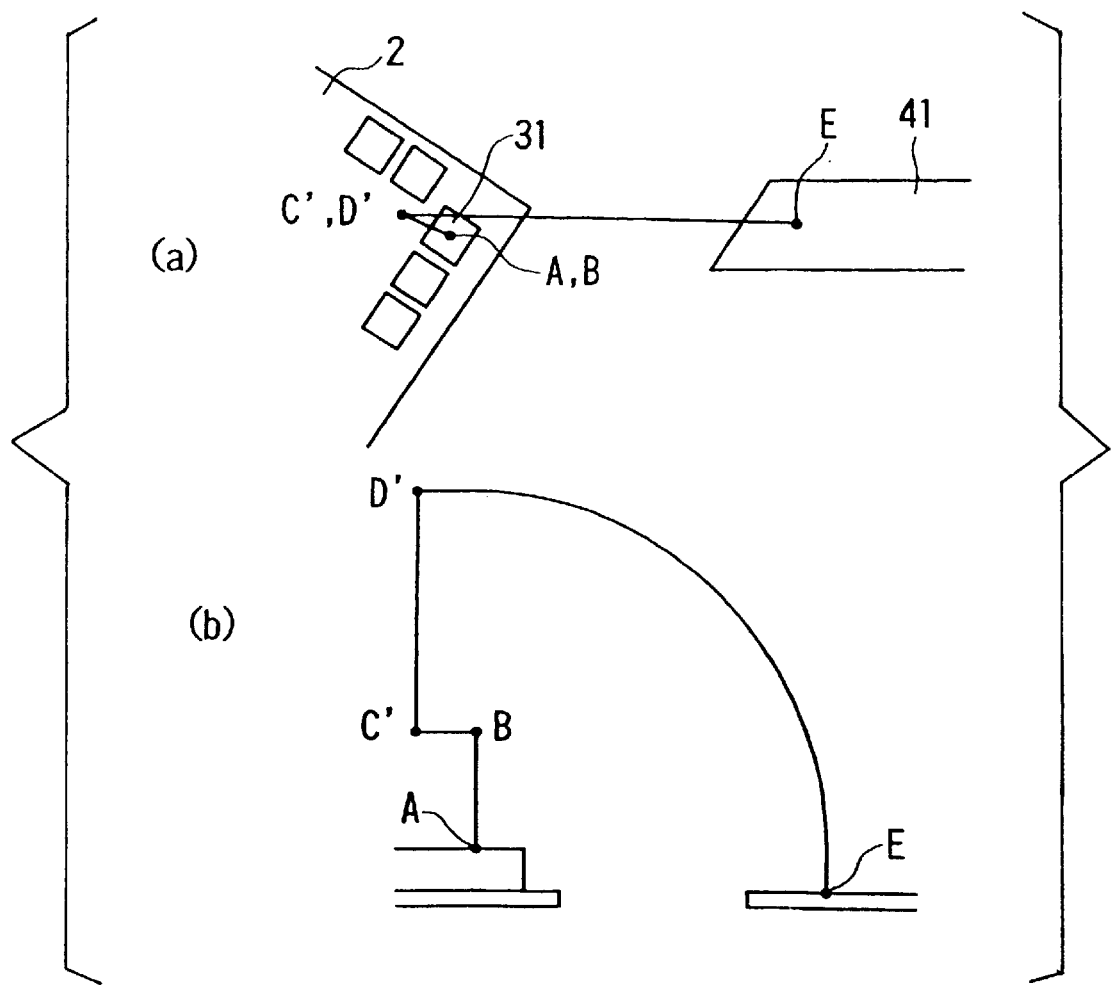
Figure 4:
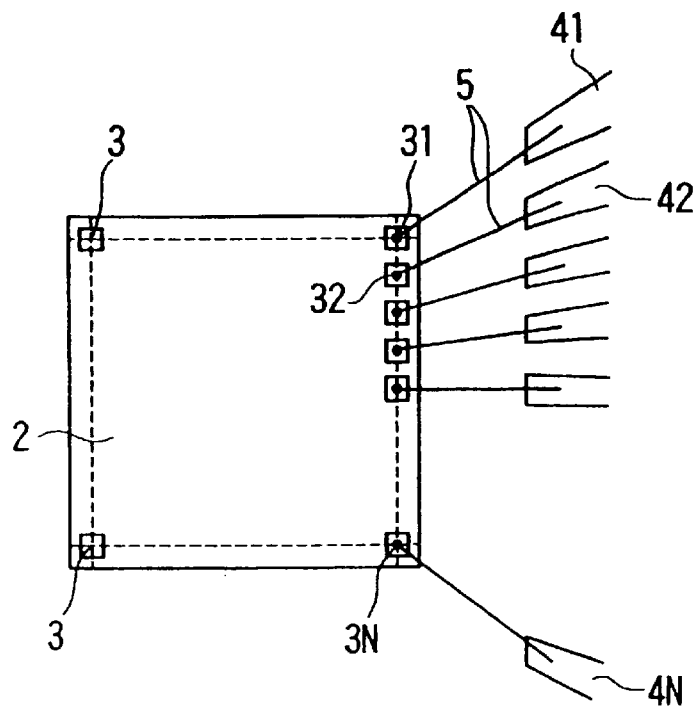
FIG. 4 is a top view of a wire-bonded semiconductor device.
Figure 5:
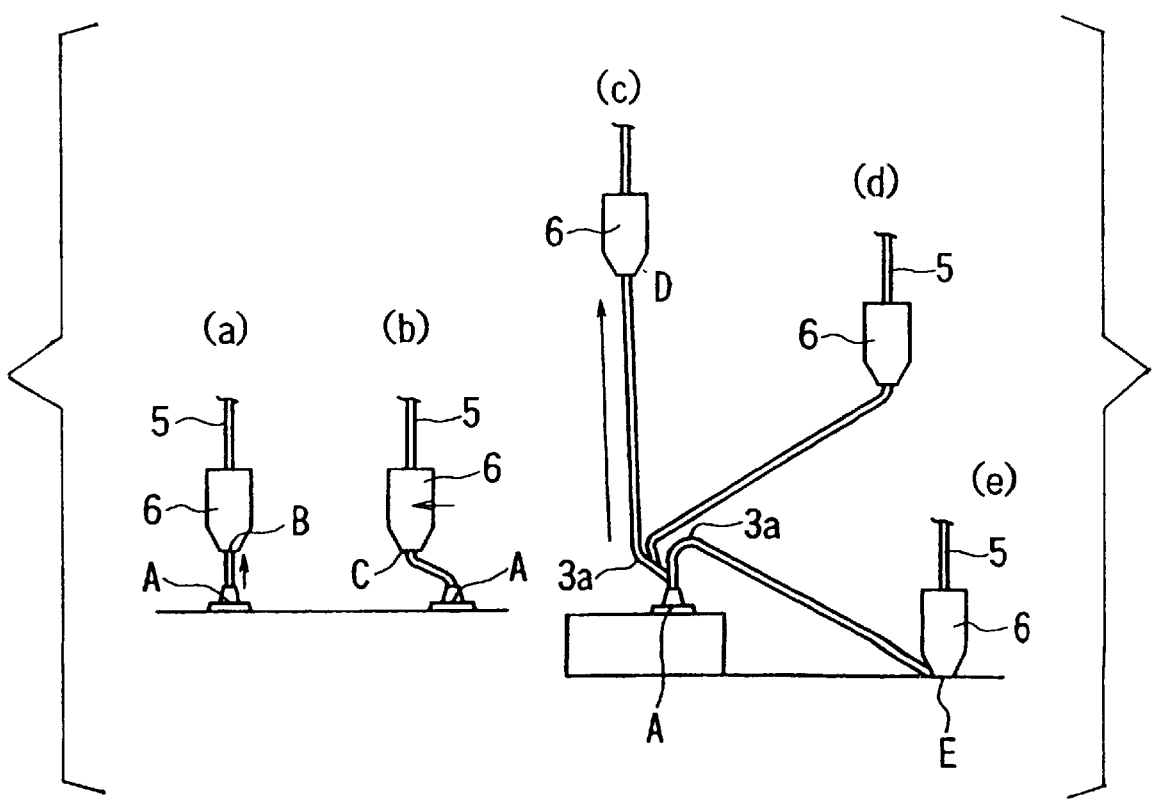
FIG. 5 shows the steps of formation of a wire shape produced by the movement of the capillary in a conventional wire bonding method.
Figure 6:
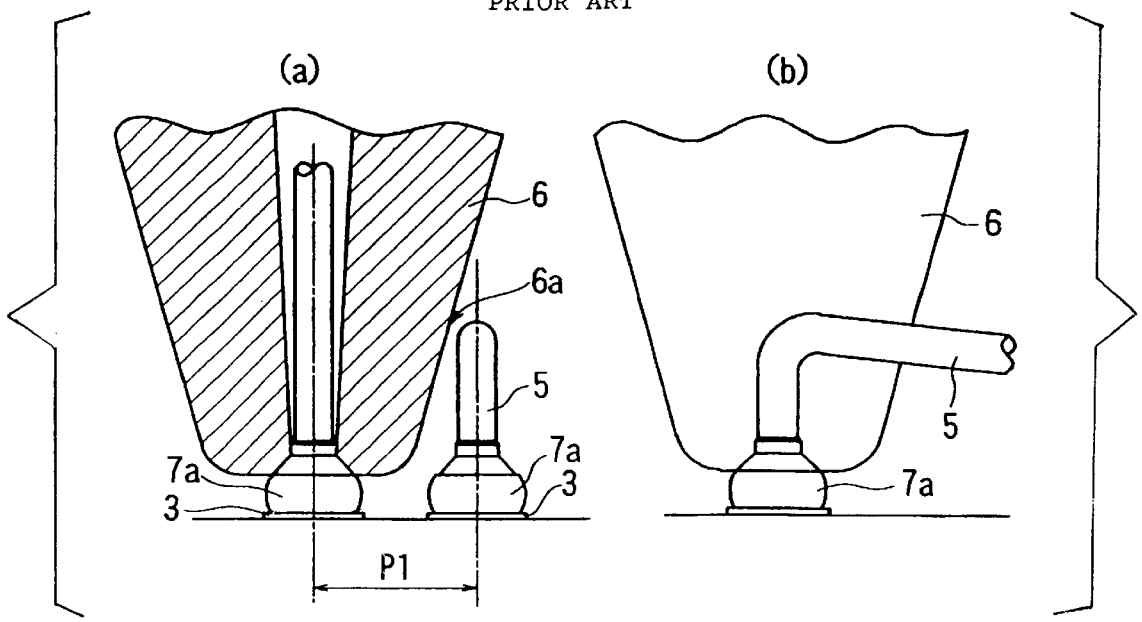

One example of the above wire bonding method will be described with reference to the bonding of the pad 31 and lead 41 as shown in FIG. 3.

First, the capillary 6 is lowered so that the ball formed at the tip end of the wire 5 is bonded to the first bonding point A (or to the pad 31). Afterward, the capillary 6 is raised slightly to point B, delivering the wire 5. Next, a reverse operation is performed in which the capillary 6 is moved to point C' while being shifted slightly toward one end of the row (upper end in FIG. 1), instead of simply being moved horizontally by a slight amount in the opposite direction from the second bonding point E.

Then, the capillary 6 is raised to point D, delivering the wire 5 (corresponding to the amount of wire required for form a wire loop). Next, the capillary 6 is moved to the second bonding point E in a circular-arc motion with a radius centered on the first bonding point A or a point near the first bonding point A, and the wire 5 is bonded to the second bonding point E or the lead 41.

As seen from the above, when the reverse operation from point B to point C' is performed, the wire loop that is formed as a result of the reverse operation assumes a shape in which the uppermost point 5a is pushed over slightly to the outside of the row of pads 3 (31, 32 . . . 3N) from a (imaginary) straight line connecting the first bonding point A and second bonding point E as shown in FIGS. 1 and 2. The amount of capillary movement that is required in order to push the wire loop over in the reverse operation varies according to the shape of the capillary, loop height and loop shape, and also varies according to the spacing of the pads 3 (31, 32 . . . 3N) and the angle formed by a straight line connecting the first bonding point A and second bonding point E and a (imaginary) straight line passing through the centers of the pads 3 (31, 32 . . . 3N). Accordingly, this amount of capillary movement is determined in advance by experiment. In some cases, it is desirable that the amount by which the loop is pushed over be small in the center of the row of pads 3 (31, 32 . . . 3N). Accordingly, the amount of capillary movement may also be controlled in proportion to the distance from the center of the row of pads 3 (31, 32 . . . 3N).

The amount of movement of the capillary in the reverse operation is entered and automatically set by an operating means based upon bonding coordinate data stored in the memory means of the control device of the bonding apparatus.

With the use of the bonding method described above, the wire loop shape from the first bonding point A to the vicinity of the uppermost point 5a is such that the wire loop shape can avoid the capillary 6 from contacting already-bonded wires 5 when the capillary 6 is lowered in order to bond the ball 7 to the first bonding point A. When the loops between the entire row of pads 3 (31, 32 . . . 3N) and all the leads 41, 42, . . . 4N are viewed, the loops appear to be pushed over to both ends of the row from the center of the row.

It is desirable that the final bonding point of the row be exactly at the center of the row; however, the same effect is obtainable if the final bonding is made to the pad at not exactly the center of the row but to the pad located near the center of the row. The final bonding (to the pad 3N/2+1) in the row is shown in FIG. 2. Wires 5 have already been bonded to the pads 3N/2 and 3N/2+2 as shown in FIG. 2. However, since these loops are pushed over in directions away from the capillary 6, the loops do not contact the capillary 6 when bonding is performed to the pad 3N/2+1. Furthermore, since the capillary 6 can avoid touching the bonded wires, the capillary 6 can be made thick by an amount corresponding to the amount by which the wires 5 are pushed over in the direction F away from the capillary 6; thus, the strength of the capillary 6 can be increased and the useful life is extended.

As seen from the above, according to the present invention, bonding is initiated from one end of the row of pads and is successively performed toward the center of the row, and after bonding has been performed up to the approximate center of the row, then bonding is initiated from another end of the row toward the center of the row, thus performing wire bonding to the remaining pads of the row. Accordingly, wire bonding can be performed on semiconductor devices that have a narrow pad spacing.

What is claimed is:

1. A wire bonding method in which first bonding points and second bonding points are connected by wires, a bonding order in which wire bonding is respectively performed on a plurality of first bonding points which are arranged in a linear row at substantially equal intervals and on a plurality of second bonding points that correspond to the first bonding points is set so that bonding is initiated from one end of said row and is successively performed in one direction toward a center of said row, and after bonding has been performed up to an approximate center of said row, bonding is initiated from another end of said row in another direction which is opposite from said one direction so as to perform wire bonding on remaining bonding points in said row.

2. A wire bonding method according to claim 1, wherein said bonding order is automatically set by an operating means of a control device of a bonding apparatus based upon sequences of coordinate data for said first bonding points and said second bonding points stored in a memory means of said control device prior to an initiation of said bonding.

3. A wire bonding method according to claim 1, portions at a vicinity of uppermost points of loops of said wires bonded between said first and second bonding points are bent toward one of said ends of said row from straight lines connecting said first and second bonding points.

4. A wire bonding method according to claim 1, wherein a reverse operation is performed after bonding is performed to said first bonding point, said reverse operation raising said capillary and then moving said capillary in a direction opposite from said second bonding point, and said reverse operation further involving a movement that shifts said capillary toward one of said ends of said row.

5. A wire bonding method according to claim 4, wherein an amount of movement of said capillary during said reverse operation that moves said capillary toward one of said ends of said row is automatically set by an operating means of a control device of a bonding apparatus based upon sequences of coordinate data for said first bonding points and said second bonding points stored in a memory means of said control device prior to an initiation of said bonding.

* * * * *